(12) United States Patent
Clarke

(10) Patent No.: US 6,783,638 B2
(45) Date of Patent: Aug. 31, 2004

(54) FLAT MAGNETRON

(75) Inventor: Peter J. Clarke, Santa Barbara, CA (US)

(73) Assignee: Sputtered Films, Inc., Santa Barbara, CA (US)

( * ) Notice: Subject to any disclaimer, the term of this patent is extended or adjusted under 35 U.S.C. 154(b) by 53 days.

(21) Appl. No.: 09/949,181

(22) Filed: Sep. 7, 2001

(65) Prior Publication Data

US 2003/0047443 A1 Mar. 13, 2003

(51) Int. Cl.[7] .............................................. C23C 14/35
(52) U.S. Cl. ........................... 204/192.12; 204/298.19; 204/298.06; 204/298.12; 204/298.14; 204/298.17
(58) Field of Search ....................... 204/192.12, 298.06, 204/298.12, 298.14, 298.17, 298.19, 298.2

(56) References Cited

U.S. PATENT DOCUMENTS

| | | | | |
|---|---|---|---|---|
| 4,404,077 A | * | 9/1983 | Fournier ................ | 204/298.19 |
| 4,427,524 A | * | 1/1984 | Crombeen et al. ..... | 204/298.06 |
| 4,486,287 A | | 12/1984 | Fournier | |
| 4,547,279 A | | 10/1985 | Kiyota et al. | |
| 4,572,776 A | * | 2/1986 | Aichert et al. ......... | 204/298.19 |
| 4,946,576 A | * | 8/1990 | Dietrich et al. ........ | 204/298.06 |
| 5,133,850 A | | 7/1992 | Kukla et al. | |
| 5,174,880 A | | 12/1992 | Bourez et al. | |
| 5,266,178 A | * | 11/1993 | Sichmann ............... | 204/298.19 |
| 5,558,749 A | | 9/1996 | Yokoyama et al. | |
| 5,597,459 A | | 1/1997 | Altshuler | |

FOREIGN PATENT DOCUMENTS

| | | | |
|---|---|---|---|
| JP | 63-317671 | * | 6/1987 |
| RU | 2135634 C1 | | 8/1999 |

* cited by examiner

Primary Examiner—Rodney G. McDonald
(74) Attorney, Agent, or Firm—Fulwider Patton; Ellsworth R. Roston

(57) ABSTRACT

An electric field is provided in a first direction between an anode and a target having a flat disposition. A magnetic field is provided such that the magnetic flux lines are in a second direction substantially perpendicular to the first direction. The magnet structure may be formed from permanent magnets extending radially in a horizontal direction, like the spokes of a wheel, and from magnetizable pole pieces extending vertically from the opposite ends of the spokes. The permanent magnets and the pole pieces define a well. The target is disposed in the well so that its flat disposition is in the same direction as the magnetic flux lines. Molecules of an inert gas flow through the well. Electrons in the well move in a third direction substantially perpendicular to the first and second directions. The electrons ionize molecules of the inert gas. The ions are attracted to the target and sputter atoms from the surface of the target. The sputtered atoms become deposited on a substrate. Reflectors in the well near the radially outer walls of the magnet structures, and also in one embodiment near the radially inner walls of the magnet structures, prevent the electrons from striking the permanent magnets. The reflectors and the anode are cooled by a fluid (e.g. water). The resultant magnetron sputters as much as 65% of the material from the target on the substrate in contrast to a sputtering of approximately 35% of material from the targets on substrates in the prior art.

72 Claims, 4 Drawing Sheets

FLAT MAGNETRON

This invention relates to apparatus for, and methods of, depositing materials on a substrate. More particularly, the invention relates to apparatus for, and methods of, sputtering atoms from a target for a deposition of the sputtered atoms on a substrate. The invention provides for a sputtering of a considerably greater percentage of the material from the target than in the apparatus of the prior art.

BACKGROUND OF PREFERRED EMBODIMENTS OF THE INVENTION

Integrated circuit chips are formed from a plurality of layers. Some of the layers may be electrically insulating and other layers may be electrically conductive. Each of the layers may be formed by providing a magnetron to deposit atoms of a preselected material on a substrate. The preselected material may be obtained from a target formed from the preselected material, the target being disposed in a cavity.

Electrical and magnetic fields are provided in the cavity. Electrons in the cavity respond to the combination of the electrical and magnetic fields to ionize molecules of an inert gas introduced into the cavity. The gas ions are attracted to the target with a sufficient energy to sputter atoms from the surface of the target. The sputtered atoms become deposited on the substrate.

In order to provide an optimum efficiency in the sputtering of atoms from the target, the magnetic flux lines should extend through and also just above the target in substantially the same direction as the disposition of the target in the magnetic field. This has not occurred in the magnetrons of the prior art. As a result, only about thirty-five percent (35%) of the material has been sputtered from the targets in magnetrons of the prior art.

Targets are expensive. The sputtering from the targets of the prior art of approximately only thirty-five percent (35%) of the material in the targets represents a significant cost to an organization which is using the targets to deposit layers of material on a substrate. Furthermore, it is time-consuming, and therefore costly, to set up a magnetron to deposit a layer of material from a target on a surface of a substrate. It would accordingly be desirable to provide a magnetron in which substantially all of the material in a target is sputtered on the surface of a substrate.

BRIEF DESCRIPTION OF A PREFERRED EMBODIMENT OF THE INVENTION

An electric field is provided in a first direction between an anode and a target having a flat disposition. A magnetic field is provided by a magnet structure such that the magnetic flux lines are in a second direction substantially perpendicular to the first direction. The magnet structure may be formed from permanent magnets extending radially in a horizontal direction, like the spokes in a wheel, and from magnetizable pole pieces extending vertically from the opposite ends of the horizontally disposed permanent magnets. The horizontal permanent magnets and the vertical magnetizable walls define a well.

The target is disposed in the well so that its flat disposition is in the same direction as the magnetic flux lines. Molecules of an inert gas flow through the well. Electrons in the well move in a third direction substantially perpendicular to the first and second directions. The electrons ionize gas molecules. The ions are attracted to the target and sputter atoms from the surface of the target. The sputtered atoms become deposited on a substrate. Reflectors in the well near the radially outer magnetizable walls of the magnet structure, and also in one embodiment near the radially inner magnetizable walls of the magnet structure, prevent electrons from striking the magnet structure. The reflector(s) and the anode are cooled by a fluid (e.g. water).

The resultant magnetron sputters as much as 65% of the material from the target on the substrate in contrast to a sputtering of approximately 35% of the material from the targets on substrates in the prior art.

DETAILED DESCRIPTION OF A PREFERRED EMBODIMENT OF THE INVENTION

Figure 1:
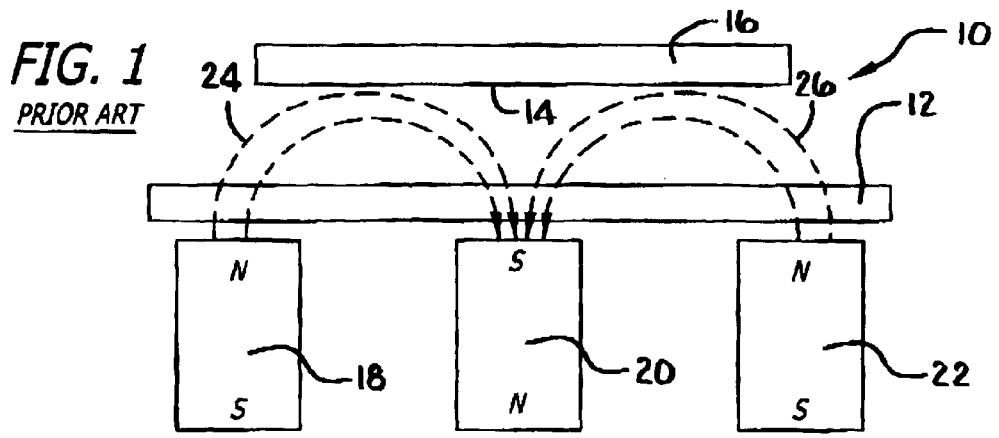
FIG. 1 schematically illustrates a portion of a magnetron of the prior art for producing a magnetic field which is used in combination with an electrical field (not shown) for sputtering atoms from a target for a deposition of the atoms on a surface of a substrate.

FIG. 1 illustrates on a simplified basis a portion of a prior art embodiment, generally indicated at 10, of a magnetron of the prior art. The prior art embodiment 10 includes a target 12 made from a material to be sputtered on a surface 14 of a substrate 16. Integrated circuits are provided on the substrate 16 by depositing successive layers of materials (e.g., titanium, copper or silicon) from different targets such as the target 12.

A plurality of magnets 18, 20 and 22 are disposed in a spaced relationship to one another and in a contiguous relationship to the target 12. The magnets 18, 20 and 22 may respectively have north, south and north poles in contiguous relationship to the target 12. Thus, flux lines 24 (shown in broken lines) extend between the magnets 18 and 20 and flux lines 26 (shown in broken lines) extend between the magnets 20 and 22. The flux lines 24 and 26 intersect the target 12 in a direction having a major component perpendicular to the target 12. The components of the flux lines perpendicular to the target are not active in facilitating the sputtering of atoms from the target 12 since they are in the same direction as an electrical field (not shown). The component of the flux lines 24 parallel to the target 12 are active in facilitating the deposition of sputtered atoms from the target 12 on the substrate 16.

Figure 2:
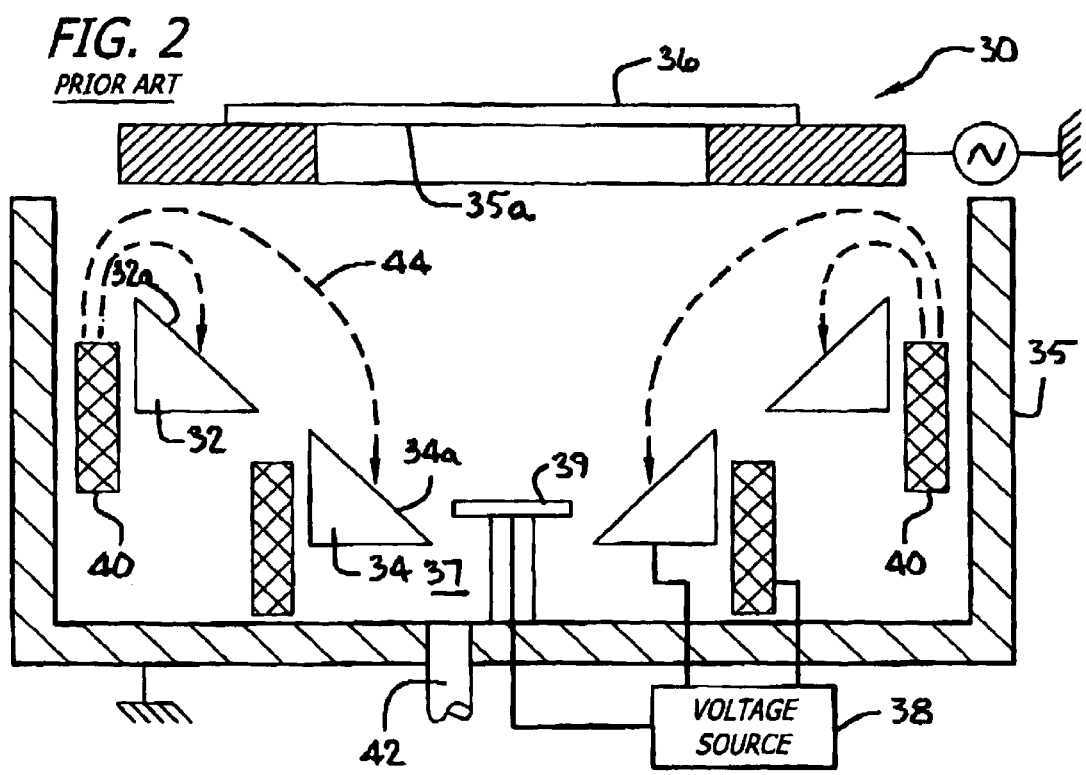
FIG. 2 schematically illustrates another magnetron of the prior art for sputtering atoms from a surface of a target for a deposition of the atoms on a surface of a substrate.

FIG. 2 illustrates on a simplified basis another embodiment, generally indicated at 30, of a magnetron of the prior art. The prior art magnetron 30 may include a pair of targets 32 and 34 which may be spaced from a grounded shield 35. Each of the targets 32 and 34 may be provided with a suitable configuration such as a hollow frusto-conical configuration. The target 32 may be more closely spaced to the shield 35 than the target 34 and may be disposed on the same axis as the target 34. The target 32 may be provided with a greater radius than the target 34. The targets 32 and 34 may be made from the material which is to be deposited in a layer on a surface 35 of a substrate 36. For example, the targets 32 and 34 may be made from copper when the copper layer is to be deposited on the surface 35a of the substrate 36.

An anode 39 is disposed in a spaced relationship to the target 34, preferably in a coaxial relationship with the targets 32 and 34. A cavity 37 is produced between the anode 39 and the targets 32 and 34. A positive voltage difference may be produced between the anode 39 and the targets 32 and 34 as from a voltage source 38. This voltage difference between the anode 39 and the targets 32 and 34 produces an electrical field. This electrical field causes electrons to be produced in the cavity 37 defined by the anode 36 and the targets 32 and 34. Magnets 40 may be disposed relative to the targets 32 and 34 to produce a magnetic field in a substantially perpendicular relationship to the electrical field between the anode 36 and the targets 32 and 34.

Molecules of an inert gas such as argon are introduced as at 42 into the cavity 37 where the electric and magnetic fields are provided. These molecules are ionized by electrons in the cavity 37. The ionization of the argon molecules is facilitated because the electrons travel in a spiral path in the cavity as a result of the transverse relationship between the magnetic and electrical fields, thereby increasing the tendency of the electrons to strike and ionize gas molecules. The positive ions of argon travel to the targets 32 and 34 and cause atoms to be sputtered from the surfaces of the targets. These atoms move to the exposed surface 35a of the substrate 36 and become deposited on this surface.

As will be seen schematically at 44 in FIG. 2, magnetic flux lines move through the targets 32 and 34 in FIG. 2. The magnetic flux lines 44 are transverse to a surface 32a of the target 32 and to a surface 34a of the target 34. The surfaces 32a and 34a are the surfaces from which the atoms in the targets 32 and 34 are sputtered.

The transverse relationship between the flux lines 44 and the surfaces 32a and 34a limits the rate at which the argon ions are produced by the electrons and the rate at which the argon ions sputter atoms from the surfaces 32a and 34a for deposition on the surface 35 of the substrate 36. Furthermore, this transverse relationship limits the amount of the material which can be sputtered from the surface 32a of the target 32 and from the surface 34a of the target 34.

Figure 3:
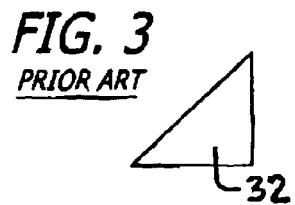
FIG. 3 is an elevational view schematically showing a portion of a target which is included in the magnetron shown in FIG. 2 and which is provided with its original shape before any sputtering of atoms from the surface of the target.
Figure 4:
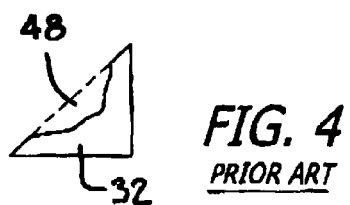
FIG. 4 is an elevational view schematically illustrating the portion of the target shown in FIG. 3 after the maximum amount of atoms has been sputtered from the surface of the target by the prior art magnetron shown in FIG. 2.

FIG. 3 indicates a portion of the target 32 on a schematic basis. The amount of the material sputtered from each of the targets is indicated at 48 in FIG. 4. In the prior art, the amounts of the material sputtered from each of the targets 32 and 34 is about thirty-five percent (35%). This is considerably less than optimal since it would be preferable to sputter almost all of the material from each of the targets 32 and 34.

Since the targets 32 and 34 are costly, the cost of depositing successive layers on the surface 35a of the substrate 36 is significantly increased. Furthermore, the time for setting up successive ones of the targets 32 and 34 becomes considerably increased because only a relatively small amount 48 of material is sputtered from each of the targets.

Figure 5:
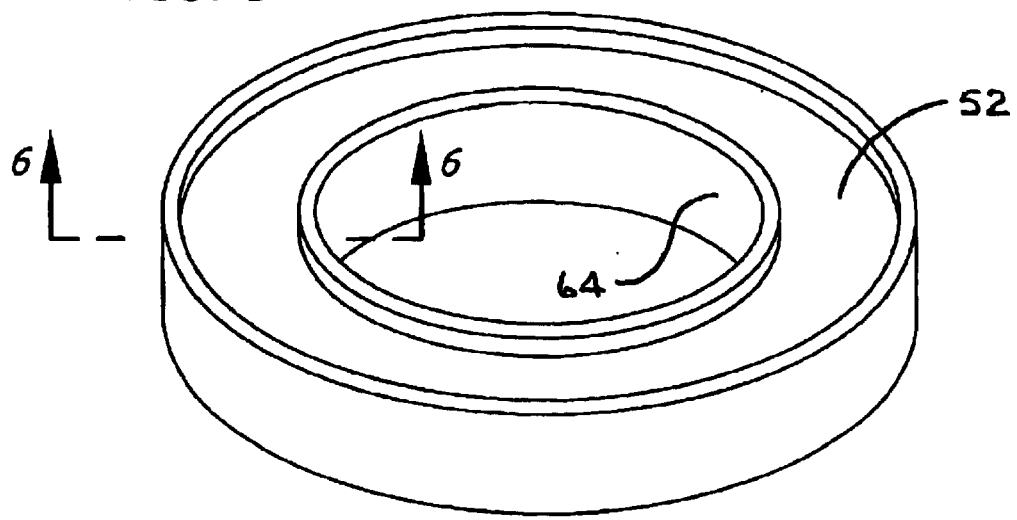
FIG. 5 is a perspective view of a target which is used in a preferred embodiment of a magnetron constituting this invention.
Figure 6:
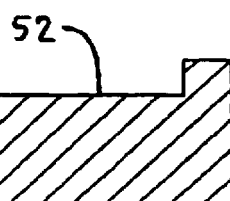
FIG. 6 is a sectional view of a portion of the target shown in FIG. 5 and is taken substantially on the line 6—6 of FIG. 5.
Figure 7:
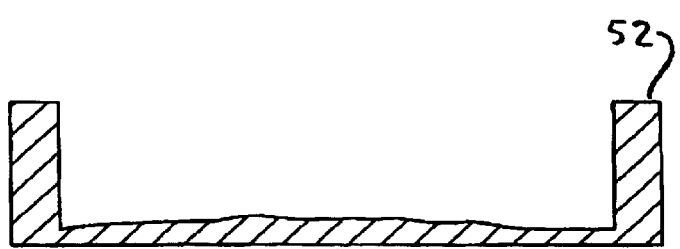
FIG. 7 is a sectional view similar to that shown in FIG. 6 and shows the portion of the target after the maximum amount of material has been sputtered from the target by the preferred embodiment of the magnetron constituting this invention.
Figure 12:
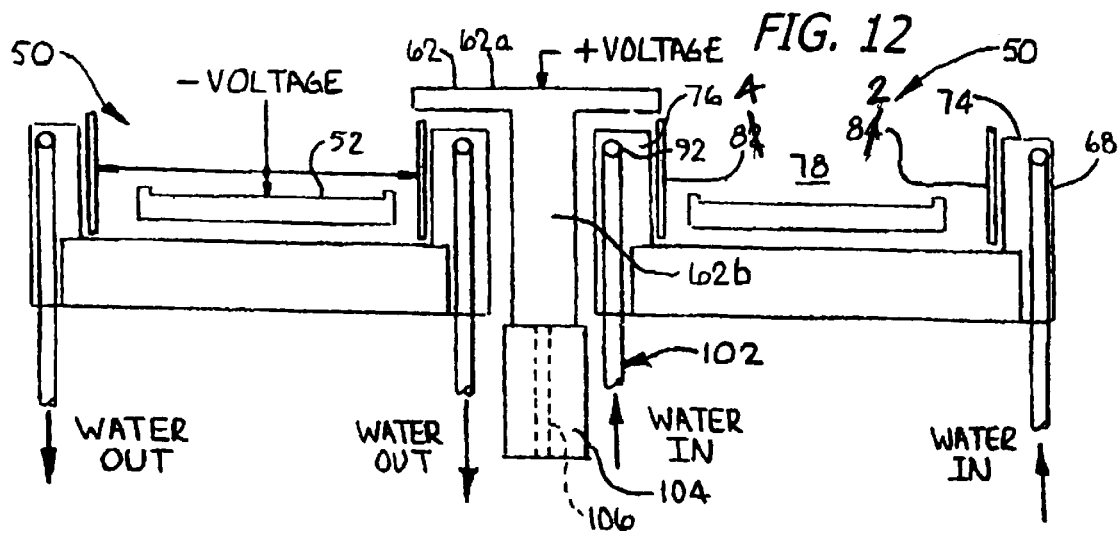
FIG. 12 is a schematic elevational view showing the anode, the target and the magnet structure and further showing reflectors for preventing charged particles from reaching the magnet structure and additionally showing elements for cooling the anode and the reflectors and also showing the path of introducing gas molecules into a well defined by the magnet structure.

A magnetron generally indicated at 50 (FIGS. 9 and 12) constitutes a preferred embodiment of the invention. The magnetron 50 provides a distinctive improvement over the prior art because it includes a target 52 (FIGS. 5–7) having a flat disposition and because it provides a magnetic field with magnetic flux lines 54 (FIG. 10) which extend in a flat disposition through the target and also just above the target in a direction corresponding to the flat disposition of the target. This is advantageous because it enhances the rate at which the atoms are sputtered from the target and are deposited on a surface 56 (FIG. 9) of a substrate 58. Furthermore, the amount of the material sputtered from the target 52 is on the order of sixty-five percent (65%). This is almost double the amount of the material which is sputtered from the target 12 in FIG. 1 of the prior art and from the targets 32 and 34 in FIG. 2 of the prior art.

The magnetron 50 includes a housing (generally indicated at 60 in FIG. 9) in which the components in the preferred embodiment of the invention are disposed. These components include an anode 62 (FIGS. 9, 10 and 12) which may be provided with a voltage in the range of a ground potential (0 volts) to a positive voltage such as approximately sixty volts (60V). The anode 62 may be made from a suitable material such as copper.

Figure 8:
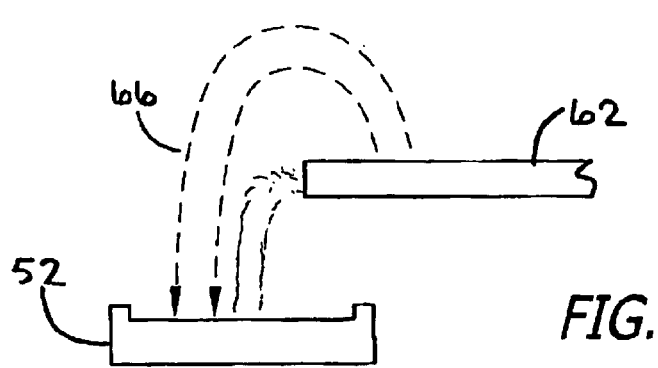
FIG. 8 is a schematic elevational view showing the target and an anode and an electrical field (in broken lines) produced between the anode and the target in the preferred embodiment of the magnetron constituting this invention and shown in FIGS. 5–7.

The target 52 is spaced from the anode 62. The target 52 and the anode 62 define a cavity. The target 52 is made from a material which is sputtered by the magnetron 50 on a surface 57 of the substrate 58. The target 52 may be provided with a suitable potential such as minus five hundred volts (−500V.), which is negative relative to the voltage on the anode 62. The target 52 may be provided with a cylindrical configuration such as a disc-like configuration having an opening 64 (FIG. 5) at the center of the disc. The difference in the voltages on the anode 62 and the target 52 causes an electrical field 66 to be produced between the anode and the target. The electrical field 66 is indicated schematically in broken lines in FIG. 8. As will be seen, the electrical field 66 is substantially perpendicular to the planar surfaces at the top and bottom of the target.

Figures 9, 10, 11:
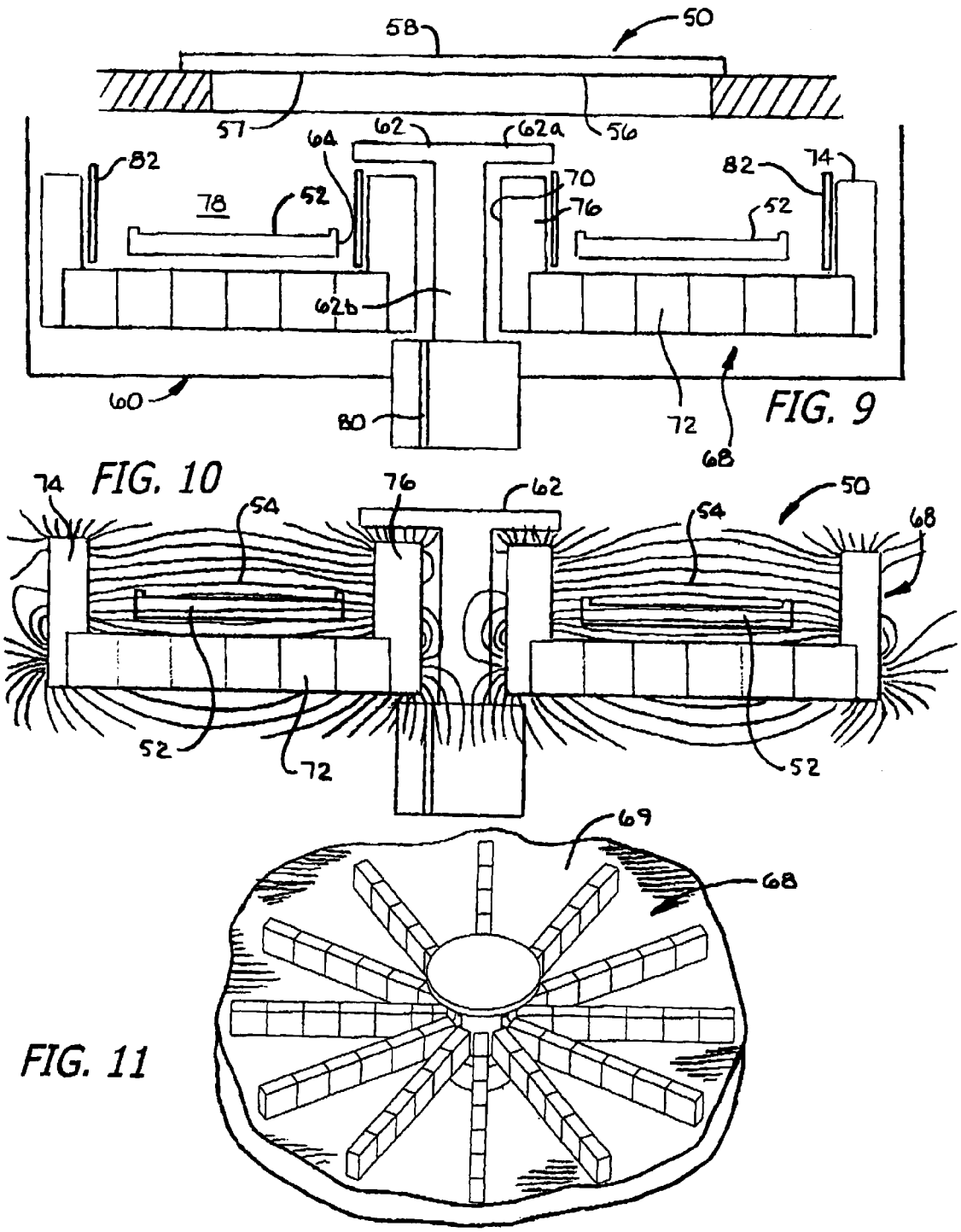
FIG. 9 is a schematic elevational view of the anode, the target and a magnet structure in which the target is disposed in the preferred embodiment of the invention.
FIG. 10 is a schematic elevational view similar to that shown in FIG. 9 and shows magnetic flux lines in a magnetic field produced by a magnet structure included in a preferred embodiment of the magnetron constituting this invention.
FIG. 11 is a perspective view of the magnet structure shown in FIG. 10 and a support for the magnet structure.

A magnet structure generally indicated at 68 in FIG. 9 is displaced from the target 52 and is displaced on a support 69 (FIG. 11) having a horizontal support surface. The magnet structure 68 is unitary. The magnet structure 68 may be provided with a suitable electrical potential such as ground. The unitary magnet structure is provided with an annular configuration and with an opening 70 at the center of the annulus. The magnet structure includes permanent magnets 72 which extend radially outwardly in a horizontal direction in a configuration corresponding to the spokes of a wheel. This is shown in FIGS. 9, 14 and 15. Magnetizable pole pieces 74 extend upwardly from the horizontally disposed permanent magnets 72 at the radially outward end of the horizontally disposed permanent magnets. In like manner, magnetizable pole pieces 76 extend upwardly from the horizontally disposed permanent magnets 72 at the radially inner end of the horizontally disposed permanent magnets. The support 69 and the upwardly extending pole pieces 74 and 76 define a well 78 (FIG. 9). The target 52 is horizontally disposed within the well 78 in spaced relationship to the permanent magnets 72 and the magnetizable pole pieces 74 and 76. As will be appreciated, the pole pieces 74 and 76 are magnetized by the permanent magnets 72.

The magnetic flux lines 54 (FIG. 10) flow through the upwardly disposed pole pieces 74, the horizontally disposed permanent magnets 72 and the upwardly disposed pole pieces 76 and across the spaces in the well 78 between the upwardly disposed pole pieces 74 and 76. As will be seen in FIG. 10, the magnetic flux lines 54 are flat and substantially horizontal. The magnetic flux lines 54 extend substantially linearly through the target 52 in a direction substantially parallel to the flat disposition of the target. The flat and substantially horizontal magnetic flux lines 54 are concentrated in and near the target 52. This causes a force to be produced on the electrons in the well 78 at right angles to the direction of the flux lines 54.

The electrons move in a direction substantially perpendicular to the electrical field 66 and the magnetic flux lines 54. This direction is horizontal and substantially perpendicular to the plane of the paper. The electrons may follow a helical path in moving in this direction. This helical path enhances the probability that the electrons will strike and ionize molecules of an inert gas such as argon in the well 78. The argon molecules pass into the housing 60 through a conduit 80 (FIG. 9) and move through the space between the anode 62 and the vertically disposed pole pieces 74 and 76 of the magnet structure 68 for exit from the housing 60.

The argon ions are attracted to the target 52 which is at a negative potential relative to the positive charge on the argon ions. The argon ions are particularly attracted to the target 52 because they are relatively close to the target 52 and because the target has a negative voltage of approximately minus five hundred volts (−500 V.). The argon ions move to the surface of the target 52 and sputter atoms from the surface of the target. These atoms move to the surface 57 (FIG. 9) of the substrate 58 and become deposited on the substrate surface.

The production of the magnetic flux lines 54 in the same direction as the disposition of the target 52 offers certain important advantages. One advantage is that approximately sixty-five percent (65%) of the material in the target 52 is sputtered from the target. This is in contrast to the sputtering of only approximately thirty-five percent (35%) of the target material in the magnetrons of the prior art. This is particularly significant because targets such as the target 52 are quite expensive.

Another advantage of the magnetron 50 is that the rate of sputtering atoms from the surface of the target 52 and depositing the sputtered atoms on the surface 57 of the substrate 58 is enhanced. This also results from the production of the magnetic flux lines 54 in the same direction as the disposition of the target 52 and from the passage of the flux lines through and near the target.

A reflector 82 (FIGS. 9 and 12) is disposed within the well 78 in close proximity to the upwardly extending pole pieces 74 of the magnet structure 68 and is preferably provided with a negative potential approximating the negative potential of the target 52. The reflector 82 preferably extends vertically to a position at or above the top of the pole pieces 74. The reflector 82 prevents electrons from reaching the upwardly extending pole pieces 74. It is undesirable for electrons to reach the upwardly extending pole pieces 74 because the deposition of the electrons on the pole pieces may affect the ground potential on the pole pieces and may affect the magnetic properties of the magnet structure 68.

A reflector 84 may also be provided in close proximity to the upwardly extending pole pieces 76 of the magnet structure 68 to perform the same functions relative to the pole pieces as the reflector 82 provides for the pole pieces 74. The reflector 84 preferably extends to a height at or above the height of the upwardly extending pole pieces 76. The reflector 84 is preferably provided with a negative potential approximately that of the target 52.

Figure 13:
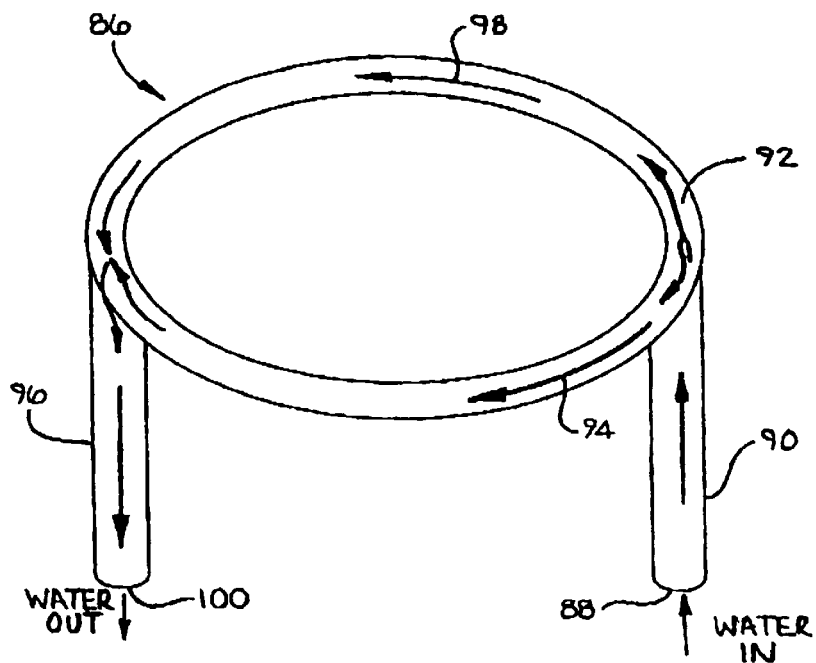
FIG. 13 is a perspective view showing in additional detail the cooling system for one of the reflectors and for the target and the anode shown in FIG. 12.

The reflectors 82 and 84 are preferably cooled. The cooling of the reflector 82 may be provided by a cooling system generally indicated at 86 in FIG. 13. The system 86 includes an input nozzle 88 for providing water at a vertical level corresponding approximately to the level of the target 52. An input conduit 90 extends upwardly from the input nozzle 88 to an annular passageway 92 at or near the top of the upwardly extending permanent magnets 74. The annular passageway encircles the target 52. Approximately half of the water flows around the passageway 92 in a clockwise direction, as indicated at 94, to an output conduit 96 and the other half of the water flows in a counterclockwise direction, as indicated at 98, to the output conduit 96. The water then flows downwardly in the output conduit 96 to an output nozzle 100. A system, generally indicated at 102 (FIG. 12), corresponding to the system 86 is provided for the reflector 84.

The anode 62 may have a T-shape with a crown portion 62a and a stem portion 62b (FIG. 12) extending integrally from the crown portion into the space defined within the vertical portion 76 of the magnet structure 68. The stem portion 62b extends into a cooling block 104 which may be made from a suitable material such as copper. The block 104 may be cooled as by a flow of water as at 106 to cool the anode 62.

A preferred embodiment may include only the reflector 84 which extends upwardly at a position radially within, but close to, the magnetic pole pieces 74. The preferred embodiment may not include the reflector 82 at the inner end of the magnet structure 68. A reflector at the inner end of the magnet structure 68 may not be needed because electrons are reflected by the intense magnetic field (magnetic mirror effect) at the inner pole piece 76.

Although this invention has been disclosed and illustrated with reference to particular preferred embodiments, the principles involved are susceptible for use in numerous other embodiments which will be apparent to persons of ordinary skill in the art. The invention is, therefore, to be limited only as indicated by the scope of the appended claims.

What is claimed is:

1. Apparatus for providing sputtered atoms for deposition on a substrate, including
   a cylindrical target,
   an anode having a positive potential relative to the potential on the target to produce an electrical field between the target and the anode in a first direction, and a unitary cylindrical magnet structure disposed relative to the anode and the target for producing a cylindrical magnetic field in a second direction substantially perpendicular to the first direction, the target being disposed within the cylindrical magnetic field in a direction corresponding substantially to the direction of the cylindrical magnetic field to provide for the disposition of the cylindrical magnetic field through the target in the direction of the target.

2. Apparatus as set forth in claim 1 wherein the magnet structure defines a cavity and wherein electrons move in the cavity in a third direction substantially perpendicular to the first and second directions and wherein molecules of an inert gas are introduced into the cavity for ionization by the electrons in the cavity and for movement of the ions to the target to sputter atoms from the surface of the target for movement of the sputtered atoms to the substrate.

3. Apparatus as set forth in claim 2 wherein the magnet structure cooperates with the anode and the target in defining the cavity.

4. Apparatus for providing sputtered atoms for deposition on a substrate, including a target, an anode having a positive potential relative to the potential on the target to produce an electrical field between the target and the anode in a first direction, and a unitary magnet structure disposed relative to the anode and the target for producing a magnetic field in a second direction substantially perpendicular to the first direction, the target being disposed in the magnetic field in a direction corresponding substantially to the direction of the magnetic field to provide for the disposition of the magnetic field through the target in the direction of the target wherein the magnet structure defines a cavity and wherein electrons move in the cavity in a third direction substantially perpendicular to the first and second directions and wherein molecules of an inert gas are introduced into the cavity for ionization by the electrons in the cavity and for movement of the ions to the target to sputter atoms from the surface of the target for movement of the sputtered atoms to the substrate the magnet structure cooperates with the anode and the target in defining the cavity, and a reflector is disposed in the cavity in a spaced relationship to the magnet structure for preventing the electrons from reaching the magnet structure.

5. Apparatus for providing sputtered atoms for deposition on a substrate, including a target, an anode having a positive potential relative to the potential on the target to produce an electrical field between the target and the anode in a first direction, and a unitary magnet structure disposed relative to the anode and the target for producing a magnetic field in a second direction substantially perpendicular to the first direction, the target being disposed in the magnetic field in a direction corresponding substantially to the direction of the magnetic field to provide for the disposition of the magnetic field through the target in the direction of the target, and a reflector disposed in the cavity relative to the magnet structure, and having a potential relative to the potential of the target, for reflecting electrons to prevent the electrons from reaching the magnet structure.

6. Apparatus for providing sputtered atoms for deposition on a substrate, including a target, an anode having a positive potential relative to the potential on the target to produce an electrical field between the target and the anode in a first direction, and a unitary magnet structure disposed relative to the anode and the target for producing a magnetic field in a second direction substantially perpendicular to the first direction, the target being disposed in the magnetic field in a direction corresponding substantially to the direction of the magnetic field to provide for the disposition of the magnetic field through the target in the direction of the target, wherein the magnet structure defines a cavity and wherein electrons move in the cavity in a third direction substantially perpendicular to the first and second directions and wherein molecules of an inert gas are introduced into the cavity for ionization by the electrons in the cavity and for movement of the ions to the target to sputter atoms from the surface of the target for movement of the sputtered atoms to the substrate and wherein the magnet structure cooperates with the anode and the target in defining the cavity and wherein a reflector is disposed in the cavity relative to the magnet structure, and has a potential relative to the potential of the target, for preventing electrons from reaching the magnet structure.

7. Apparatus for providing sputtered atoms for deposition on a substrate, including, a target, an anode displaced from the target and defining a cavity with the target and co-operating with the target to define an electrical field between the target and the anode in a first direction, and a magnet structure disposed relative to the anode and the target to provide a magnetic field defining a well with magnetic lines of force in the well in a second direction substantially perpendicular to the first direction, the anode being disposed in the magnetic field, the target being disposed in the magnetic field in the second direction relative to the magnet structure to provide for the passage of the magnetic lines of flux in the well in the second direction through and adjacent the target in a planar relationship to the target.

8. Apparatus for providing sputtered atoms for deposition on a substrate, including, a target, an anode displaced from the target and defining a cavity with the target and co-operating with the target to define an electrical field between the target and the anode in a first direction, and a magnet structure disposed relative to the anode and the target to provide a magnetic field with magnetic lines of force in a second direction substantially perpendicular to the first direction the anode being disposed in the magnetic field the target being disposed in the magnetic field in the second direction relative to the magnet structure to provide for the passage of the magnetic lines of flux in the second direction through and adjacent the target in a planar relationship to the target the magnet structure being provided with permanent magnets having opposite ends and with first and first pole pieces respectively extending from the opposite ends of the permanent magnets in a direction transverse to the permanent magnets to define a well, and the target being disposed within the well defined by the magnet structure.

9. Apparatus as set forth in claim 8, including, the permanent magnets of the magnet structure extending in substantially the second direction, and the target extending within the well in substantially the second direction.

10. Apparatus as set forth in claim 8, including, the anode and the magnet structure defining a cavity, and a conduit for introducing molecules of a gas into the cavity for ionization of the gas molecules in the cavity.

11. Apparatus as set forth in claim 9, including, a reflector disposed within the well defined by the magnet structure for inhibiting the movement of electrons from the well.

12. Apparatus as set forth in claim 9, including:

the anode and the magnet structure defining a cavity, a conduit for introducing molecules of a gas into the cavity for ionization of the gas molecules in the cavity, and a reflector disposed within the cavity in spaced relationship to the first and second pole pieces of the magnet structure for inhibiting the electrons from reaching the magnet structure.

13. Apparatus as set forth in claim 9, including the target having a negative potential relative to a potential on the anode, and the first and first pole pieces of the magnet structure extending from the permanent magnets of the magnet structure in a substantially perpendicular relationship to permanent magnets of the magnet structure.

14. In apparatus for providing sputtered atoms for deposition on a substrate, a magnet structure having permanent magnets with opposite ends and having first and second pole pieces which respectively extend from the opposite ends of the permanent magnets in a transverse direction relative to the permanent magnets to define a well and to define magnetic flux lines extending in a particular substantially linear direction within the well, and a target disposed within the well in the particular substantially linear direction to receive the magnetic flux lines extending in the particular substantially linear direction within the well.

15. In apparatus as set forth in claim 14, the first and second pole pieces having opposite magnetic polarities to provide the magnetic flux lines within the well between the first and second pole pieces, the target being disposed within the well at the position of, and in an aligned relationship with, the magnetic flux lines extending in the particular substantially linear direction between the first and second pole pieces of the magnet structure.

16. In apparatus as set forth in claim 14, pole pieces of the magnet structure defining a plurality of permanent magnetic spokes each of which extends between the first pole pieces of the magnet structure and the second pole pieces of the magnet structure at angular positions spaced from the angular positions of the other ones of the spokes defined by the pole pieces of the magnet structure.

17. In apparatus as set forth in claim 14, the target being defined by a cylinder having a central opening with dimensions for the second permanent magnets of the magnet structure to extend through the central opening, and the second and second permanent magnets of the magnet structure being substantially perpendicular to the permanent magnets of the magnet structure.

18. In apparatus as set forth in claim 15, the permanent magnets of the magnet structure defining a plurality of permanent magnetic spokes each of which extends between the first pole pieces of the magnet structure and the second pole pieces of the magnet structure at angular positions spaced from the angular positions of the other ones of the spokes defined by the permanent magnets, the target being defined by a cylinder having a central opening with dimensions for the second pole pieces of the magnet structure to extend through the opening, and the first and second pole pieces of the magnet structure being substantially perpendicular to the permanent magnets of the magnet structure.

19. In apparatus for providing sputtered atoms for deposition on a substrate, a magnet structure having permanent magnets with opposite ends and having first and second pole pieces each extending from an individual one of the opposite ends of the permanent magnets in a transverse direction to the permanent magnets to define a well, the first and second pole pieces of the magnet structure having opposite magnetic polarities to provide for the flow of magnetic flux within the well between the first and second pole pieces in a substantially linear direction between the first and second pole pieces of the magnet structure.

20. In apparatus as set forth in claim 19, the magnet structure defining an annulus and the second pole pieces of the magnet structure defining an opening at the radial center of the annulus and the permanent magnets extending between the first and second pole pieces in directions defining radial spokes and the permanent magnets and the pole pieces defining the well.

21. In apparatus as set forth in claim 19, the first and second pole pieces of the magnet structure extending from the permanent magnets of the magnet structure in a direction substantially perpendicular to the permanent magnets of the magnet structure to define the well.

22. In apparatus as set forth in claim 19, the first pole pieces of the magnet structure defining a first annulus having a first diameter and the second pole pieces of the magnet structure defining a second annulus having a second diameter greater than the first diameter and having annularly spaced positions on the second annulus.

23. In apparatus as set forth in claim 20, the first and second pole pieces of the magnet structure extending from the permanent magnets of the magnet structure in a direction substantially perpendicular to the permanent magnets of the magnet structure, and the first pole pieces of the magnet structure defining an annulus having a first diameter and the second pole pieces of the magnet structure being disposed in a second annulus having a second diameter greater than the first diameter and being defined by annularly spaced positions on the second annulus.

24. Apparatus for providing sputtered atoms for deposition on a surface of a substrate including, an anode and a target disposed relative to each other and having relative potentials for creating an electrical field in a first direction, a magnet structure disposed relative to the anode and the target and defining a well for creating within the well a magnetic field having magnetic lines of flux extending in a substantially planar direction substantially perpendicular to the first direction, the target being disposed in the magnetic field within the well in the substantially planar direction to provide for the flow of the magnetic flux through the target in the substantially planar direction, the electrical and magnetic fields being disposed in a cooperative relationship to produce a movement of electrons in a third direction substantially perpendicular to the first and substantially planar directions, and a conduit for passing molecules of an inert gas into the electrical and magnetic fields to obtain an ionization of the gas molecules by the electrons and to obtain a sputtering of atoms from the target by the ionized gas molecules for deposition of the sputtered atoms on the surface of the substrate.

25. Apparatus as set forth in claim 24, including a reflector disposed relative to the magnetic structure to prevent charged particles from reaching the magnetic structure.

26. Apparatus as set forth in claim 25 wherein the target and the reflector have a negative potential relative to a potential on the anode.

27. Apparatus as set forth in claim 24 wherein a conduit is provided for moving fluid past the reflector to cool the reflector.

28. Apparatus as set forth in claim 24 wherein the magnet structure is provided with inner and outer pole pieces disposed between the permanent magnets and the permanent magnets are disposed to define a plurality of spokes extending between the inner and outer pole pieces in a spaced relationship to one another and wherein reflectors are disposed adjacent the inner and outer pole pieces of the magnet structure to prevent electrons from reaching the magnet structure.

29. Apparatus as set forth in claim 25 wherein the target and the reflector have a negative potential relative to a potential on the anode and wherein the target and the reflector are at substantially the same negative potential relative to the potential on the anode.

30. A method of providing sputtered atoms for deposition on a substrate including the steps of:

providing a cylindrical target having a flat disposition, providing an electrical field in the vicinity of the flat disposition of the target in a first direction substantially perpendicular to the flat disposition of the target, providing a magnetic field in the vicinity of the target in a second substantially linear direction substantially perpendicular to the first direction and in substantially the same direction as the flat disposition of the target, the magnetic field being provided by a unitary cylindrical magnet structure, the target being disposed in the magnetic field with the flat disposition extending in the second direction to provide for the disposition of the magnetic field in the target in the second substantially linear direction, and introducing molecules of a gas into the vicinity of the target for an ionization of the gas molecules and for a sputtering of atoms from the surface of the target by the gas ions.

31. A method of providing sputtered atoms for deposition on a substrate including the steps of:

providing a target having a flat disposition providing an electrical field in the vicinity of the flat disposition of the target in a first direction substantially perpendicular to the flat disposition of the target, providing a magnetic field in the vicinity of the target in a second substantially linear direction substantially perpendicular to the first direction and in substantially the same direction as the flat disposition of the target, the magnetic field being provided by a unitary magnet structure, the target being disposed in the magnetic field with the flat disposition extending in the second direction to provide for the disposition of the magnetic field in the target in the second substantially linear direction, and introducing molecules of a gas into the vicinity of the target for an ionization of the gas molecules and for a sputtering of atoms from the surface of the target by the gas ions wherein the magnetic field is provided within a magnetic well and wherein the target is disposed within the magnetic well.

32. A method as set forth in claim 30 wherein electrons in the vicinity of the target are subjected to the electrical and magnetic fields to provide for the movement of the electrons in a spiral path in a direction substantially perpendicular to the electrical and magnetic fields to facilitate the ionization of the gas molecules by the ions.

33. A method as set forth in claim 30 wherein lines of flux in the magnetic field extend linearly in the second direction through and also above and below the target in substantially the same direction as the flat disposition of the target.

34. A method of providing sputtered atoms for deposition on a substrate including the steps of:

providing a target having a flat disposition, providing an electrical field in the vicinity of the target in a first direction substantially perpendicular to the flat disposition of the target, providing a magnetic field in the vicinity of the target in a second direction substantially perpendicular to the first direction and in substantially the same direction as the flat disposition of the target, introducing molecules of a gas into the vicinity of the target for an ionization of the gas molecules and for a sputtering of atoms from the surface of the substrate by the gas ions wherein the magnetic field is provided within a magnetic well and wherein the target is disposed within the magnetic well and wherein lines of flux in the magnetic field within the magnetic well extend linearly through, and also adjacent, the target in substantially the same direction as the flat disposition of the target.

35. A method of providing sputtered atoms for deposition on a substrate including the steps of:

providing an electric field in a first direction, providing a magnetic field having lines of flux extending substantially linearly in a second direction substantially perpendicular to the first direction to obtain a flow of electrons in a path substantially perpendicular to the first and second directions, the magnetic field being provided within a magnetic well, disposing a target within the magnetic well in the electrical and magnetic fields with the target extending in the second direction through the lines of flux, and passing molecules of a gas into the electrical and magnetic fields to obtain an ionization of the gas molecules and a movement of the gas ions to the target for a sputtering of atoms from the surface of the target.

36. A method as set forth in claim 35 wherein a substrate is disposed relative to the target to obtain a deposition on the substrate of the atoms sputtered from the target.

37. A method as set forth in claim 35 wherein the magnetic field is produced by a magnet structure substantially in a space defining the magnetic well and wherein the target is disposed within the magnetic well and wherein the electrical field extends into the magnetic well to the target in the first direction.

38. A method as set forth in claim 35 wherein the rate of deposition of the sputtered atoms on the substrate is controllable by adjusting at least one of the intensity of the electrical field and the rate of flow of the gas molecules into the electrical and magnetic fields.

39. A method as set forth in claim 37 wherein a substrate is disposed relative to the target to obtain a deposition on the substrate of the atoms sputtered from the target and wherein the rate of deposition of the sputtered atoms on the substrate is controllable by adjusting at least one of the intensity of the electrical field and the rate of flow of the gas molecules into the electrical and magnetic fields and wherein the magnet structure is unitary.

40. A method of providing sputtered atoms for deposition on a substrate, including the steps of:

providing an electrical field in a first direction, providing a magnetic field having flux lines which extend substantially linearly in a well in a second direction substantially perpendicular to the first direction, the magnetic field being provided by a unitary magnet structure defining the well, disposing a target in the electrical and magnetic fields with the target extending in the second direction and the flux lines extending substantially linearly in the well in the second direction through the target, and passing molecules of an inert gas into the electrical and magnetic fields to obtain an ionization of the gas molecules by electrons in the electrical and magnetic fields and to obtain a sputtering of atoms from the target by the gas ions and a disposition of the sputtered atoms on the substrate.

41. A method of providing sputtered atoms for deposition on a substrate, including the steps of:

providing an electrical field in a first direction, providing a magnetic field having flux lines which extend substantially linearly in a second direction substantially perpendicular to the first direction, the magnetic field being defined by a unitary magnet structure, disposing a target in the electrical and magnetic fields with the target extending in the second direction and the flux lines extending substantially linearly in the second direction through the target, passing molecules of an inert gas into the electrical and magnetic fields to obtain an ionization of the gas molecules by electrons in the electrical and magnetic fields and to obtain a sputtering of atoms from the target by the gas ions and a disposition of the sputtered atoms on the substrate, and reflecting the electrons to maintain the electrons within the electrical and magnetic fields.

42. A method as set forth in claim 41 wherein the step of reflecting is provided by disposing a reflector in the magnetic field and wherein the reflector is cooled.

43. A method of providing sputtered atoms for deposition on a substrate, including the steps of:

providing an electrical field in a first direction, providing a magnetic field having flux lines which extend substantially linearly in a second direction substantially perpendicular to the first direction, the magnetic field being defined by a unitary magnet structure, disposing a target in the electrical and magnetic fields with the target extending in the second direction and the flux lines extending substantially linearly in the second direction through the target, and passing molecules of an inert gas into the electrical and magnetic fields to obtain an ionization of the gas molecules by electrons in the electrical and magnetic fields and to obtain a sputtering of atoms from the target by the gas ions and a disposition of the sputtered atoms on the substrate wherein the target is provided with a disc-like configuration having a central opening and wherein the magnetic field is produced within a well defined by inner and outer radii of a magnet structure and wherein the target is disposed within the well defined by the inner and outer radii of the magnet structure.

44. A method as set forth in claim 43 including the step of reflecting the electrons to maintain the electrons within the electrical and magnetic fields.

45. Apparatus as set forth in claim 1 wherein the target is non-magnetizable.

46. Apparatus as set forth in claim 6 wherein the target is made from a material selected from the group consisting of titanium, copper and silicon.

47. Apparatus as set forth in claim 7 wherein the target is made from a non-magnetizable material.

48. Apparatus as set forth in claim 12 wherein the target is made from a material selected from the group consisting of titanium, copper and silicon.

49. In apparatus as set forth in claim 14 wherein the target is made from a non-magnetizable material.

50. In apparatus as set forth in claim 18 wherein
the target is made from a material selected from the group consisting of titanium, copper and silicon.
51. In apparatus as set forth in claim 24,
the target being made from a non-magnetizable material.
52. In apparatus as set forth in claim 28 wherein
the target is made from a material selected from the group consisting of titanium, copper and silicon.
53. A method as set forth in claim 30 wherein
the target is made from a non-magnetizable material.
54. A method as set forth in claim 32 wherein
the magnetic field is provided within a well and wherein the target is disposed within the well and wherein the target is made from a non-magnetizable material.
55. A method as set forth in claim 34 wherein
the target is made from a non-magnetizable material.
56. A method as set forth in claim 35 wherein
the target is made from a non-magnetizable material.
57. In apparatus for providing sputtered atoms for deposition on a substrate,
a magnet structure constructed to define a well and to produce magnetic flux in a linear direction within the well, and
a target disposed in the well at the position of the flux extending in the linear direction within the well and having a disposition corresponding to the linear direction of the magnetic flux.
58. In apparatus as set forth in claim 57,
an anode disposed within the well relative to the target and co-operative with the target in creating an electrical field in a direction transverse to the linear direction.
59. In apparatus as set forth in claim 57,
a source of molecules of an ionizable gas, the source providing for the introduction of the molecules of the ionizable gas into the well to become ionized by electrons within the well and to provide for the sputtering of atoms from the target by the gas ions within the well.
60. In apparatus as set forth in claim 57,
the anode being co-operative with the target in creating the electrical field in a direction substantially perpendicular to the linear direction, and
a source of molecules of an inert gas, the source providing for the introduction of the molecules of the inert gas into the well to become ionized by electrons within the well and to provide for the sputtering of atoms from the target the molecules ionized within the well.
61. In apparatus as set forth in claim 57,
the magnet structure being unitary.
62. In apparatus as set forth in claim 58,
a source of molecules of an inert gas, the source providing for the introduction of the molecules of the inert gas into the well to become ionized by electrons within the well and to provide for the sputtering of atoms from the target by the gas ions within the well,
the anode being co-operative with the target in creating the electrical field in a direction substantially perpendicular to the linear direction, and
the magnet structure being unitary.
63. In apparatus as set forth in claim 19,
the magnet structure being unitary.

64. In apparatus as set forth in claim 19,
a target disposed within the well to receive the magnetic flux in the substantially linear direction within the well, the target being planar in the substantially linear direction.
65. In apparatus as set forth in claim 20,
an anode disposed in the opening at the radial center of the annulus defined by the magnet structure to cooperate with the target in producing an electrical field within the well in a direction substantially perpendicular to the substantially linear direction.
66. In apparatus for providing sputtered atoms for deposition on a substrate, including
a target,
an anode displaced from the target and defining a cavity with the target and co-operating with the target to define an electrical field between the target and the anode in a first direction,
a magnet structure disposed relative to the target and the anode to provide a magnetic field with magnetic lines of flux in a second direction substantially perpendicular to the first direction,
the magnet structure being constructed to define a well and to produce magnetic flux in a linear direction within the well,
the target being disposed within the well at the position of the flux extending in the linear direction within the well and having a disposition corresponding to the linear direction of the magnetic flux within the well.
67. In apparatus as set forth in claim 66 wherein
the target is disposed in the magnetic field in the second direction to provide for the passage of the magnetic lines of flux in the second direction through and adjacent the target in a planar relationship to the target.
68. In apparatus as set forth in claim 66 wherein
the magnetic structure is unitary.
69. In apparatus as set forth in claim 66 wherein
the magnet structure is constructed to define a plurality of spokes each extending radially outwardly in angularly spaced relationship to the other spokes.
70. In apparatus as set forth in claim 69 wherein
each of the spokes in the magnet structure is formed from permanent magnets and pole pieces magnetized by the permanent magnets and wherein
the permanent magnets are disposed in the second direction to define opposite ends and the pole pieces extend from the opposite ends of the permanent magnets in a direction transverse to the second direction to define the well with the permanent magnets.
71. In apparatus as set forth in claim 70 wherein
the pole pieces are substantially perpendicular to the permanent magnets and wherein
a reflector is disposed relative to the pole pieces to prevent electrons from reaching the pole pieces.
72. In apparatus as set forth in claim 71 wherein
the target is disposed in the magnetic field in the second direction to provide for the passage of the magnetic lines of flux in the second direction through and adjacent the target in a planar relationship to the target and wherein
the magnet structure is unitary.

* * * * *

UNITED STATES PATENT AND TRADEMARK OFFICE
CERTIFICATE OF CORRECTION

PATENT NO. : 6,783,638 B2
APPLICATION NO. : 09/949181
DATED : August 31, 2004
INVENTOR(S) : Peter J. Clarke It is certified that error appears in the above-identified patent and that said Letters Patent is hereby corrected as shown below:

Column 9, line 23, delete "well" and insert --well (cavity)--.
Column 12, line 14, delete "disposition" and insert --disposition,--.

Signed and Sealed this

Sixth Day of March, 2007

JON W. DUDAS
*Director of the United States Patent and Trademark Office*